United States Patent [19]

George et al.

[11] 3,755,012

[45] Aug. 28, 1973

[54] CONTROLLED ANISOTROPIC ETCHING PROCESS FOR FABRICATING DIELECTRICALLY ISOLATED FIELD EFFECT TRANSISTOR

[75] Inventors: William Lloyd George, Scottsdale; James Brian Price, Phoenix, both of Ariz.

[73] Assignee: Motorola, Inc., Franklin Park, Ill.

[22] Filed: Mar. 19, 1971

[21] Appl. No.: 126,231

[52] U.S. Cl. ...................... 148/175, 29/578, 29/580, 117/200, 117/212, 148/187, 156/17, 317/101, 317/235 R

[51] Int. Cl. ......... H01l 7/50, H01l 7/00, H01l 11/14

[58] Field of Search .................... 148/174, 175, 187; 156/17; 29/578, 580, 583; 317/234, 235, 101; 117/200, 212

[56] References Cited

UNITED STATES PATENTS

| | | | |
|---|---|---|---|
| 3,381,187 | 4/1968 | Zuleeg | 317/235 |
| 3,412,296 | 11/1968 | Grebene | 317/234 |
| 3,419,956 | 1/1969 | Kren et al. | 29/580 X |
| 3,430,114 | 2/1969 | Morel | 317/235 |
| 3,453,504 | 7/1969 | Compton et al. | 148/175 X |
| 3,486,892 | 12/1969 | Rosvold | 156/17 X |
| 3,566,219 | 2/1971 | Nelson et al. | 317/235 |
| 3,575,740 | 4/1971 | Castrucci et al. | 148/175 |
| 3,597,287 | 8/1971 | Koepp | 148/187 |
| 3,623,218 | 11/1971 | Mitarai et al. | 156/17 X |

OTHER PUBLICATIONS

Stoller, A. I., "Etching of Deep Vertical . . . Silicon" R.C.A. Review, June 1970, pp. 271–275.

Rosvold et al., "Air–Gap Isolated . . . Beam–Lead Devices" IEEE Trans. on Electron Devices, Vol. Ed–15, No. 9, Sept. 1968, pp. 640–644.

Bean et al., "Influence of Crystal Orientation . . . Processing" Proc. of IEEE, Vol. 57, No. 9, Sept. 1969, pp. 1469–1476.

Electronic Engineer, "Improved Etching Technique" Vol. 26, No. 12, Dec. 1967, pp. 14 and 16.

*Primary Examiner*—L. Dewayne Rutledge
*Assistant Examiner*—W. G. Saba
*Attorney*—Mueller & Aichele

[57] ABSTRACT

There is disclosed an improved junction field effect transistor with dielectric isolation as opposed to isolation by PN junction techniques. The use of the dielectric isolation lowers parasitic capacitance and permits the use of a single gate for the control of the current from the source to the drain of the device. The use of a single gate and the dielectric isolation prevents this parasitic capacitance and the concomitant reduction of the frequency response of the device by eliminating the need for a large area second gate which generates the unwanted parasitic capacitance. In the two gate embodiment of the subject invention, the second gate area is minimized so as to minimize the parasitic capacitance. The gain of the subject device is increased by internally connecting the two gates with a deep diffused region therebetween. There is further disclosed a method for making junction field effect transistors such that the channel width is accurately controlled.

8 Claims, 15 Drawing Figures

Patented Aug. 28, 1973 3,755,012

3 Sheets-Sheet 1

PRIOR ART

INVENTOR
William L. George
BY James B. Price
Mueller & Aichele
ATTY'S.

INVENTOR
*William L. George*
*James B. Price*

BY

*Mueller & Aichele*

*ATTY'S*

INVENTOR
William L. George
James B. Price
BY
Mueller & Aichele
ATTY'S

CONTROLLED ANISOTROPIC ETCHING PROCESS FOR FABRICATING DIELECTRICALLY ISOLATED FIELD EFFECT TRANSISTOR

BACKGROUND

This invention relates to junction field effect transistors (JFETs) and more particularly to the use of dielectric isolation in the JFET for decreasing parasitic capacitance, increasing frequency response and decreasing the number of gate structures necessary for providing the "pinch-off" control of the device output.

Although junction field effect transistors have been known for some time, a short review of the structure and the function of the junction field effect transistor is now given in order to aid in understanding the improvements described herein.

It will be appreciated that a junction field effect transistor is basically a variable resistor. Typically, the junction field effect transistor (JFET) is fabricated by growing an N-type epitaxial region on a P-type wafer. Around the periphery of the N-type region is formed a P+ type diffusion through the top of the device so as to isolate the drain and the source of the device from each other. The source and the drain are formed by diffusing in two N-type contacts at opposite ends of the N-region. Inbetween the two contacts is diffused a second P+ region such that this region forms the top gate while the P-type wafer on which is grown the N-type epi, serves as the bottom gate. For current to flow from the source to the drain, it must flow through a channel which is the area between the two gates. The current through the channel is controlled by the resistance of the channel which is in turn controlled by the voltage applied to the two gates. If the source is grounded and a positive voltage is applied to the drain, then a negative potential applied to the gates to reverse bias the gate-to-channel junction, will cause the current through the channel to stabilize at some value, when a sufficient negative voltage is applied to the gates. This is called saturation. In effect, the application of the negative potentials to the gates increases the resistance between the source and the drain by creating the aforementioned reverse bias. Associated with the reverse bias is a depletion region in the channel such that there is a portion of the channel which is depleted of mobile carriers. This deprives part of the channel of all of the carriers when saturation is reached such that no current can be carried by that part. In most prior art junction field effect transistors, the gates are internally shorted by a deep diffused region which goes between the top gate and the bottom gate by means of a deep diffusion which takes place outside of the N-type region or tub. The deep diffusion therefore, goes through the P+ isolation region from the top gate to the bottom gate.

There are, however, four major problems with prior art junction field effect transistors. The first problem is that the bottom gate has a very large area as compared to the active channel area which is that area directly under the top gate. Because of the large area at the bottom gate, there is a considerable amount of parasitic capacitance which limits the high frequency response of the device. Signals applied to the gates are therefore AC shorted to the drain or source due to the parasitic capacitance. It will be appreciated that the bottom gate is in fact coextensive with the length and breadth of the N-epi region since the N-epi region is in direct contact with the P-type wafer where it forms a PN junction. Although it is the purpose of the PN junction to isolate the source of the device from the drain, it is this junction isolation technique which is specifically avoided by the subject invention so as to reduce parasitic capacitance. It will be appreciated that the parasitic capacitance existing in the active channel region cannot be reduced because there must be at least that much of a junction in order to achieve the "pinch" effect which controls the resistance of the device through the channel. It will be appreciated, however, that the active channel region occupies an area that is only 10 percent to 20 percent of the total area of the device. Thus, limiting the bottom gate area reduces the parasitic capacitance by 80 percent or more.

The second problem is the control of the N-region depth so that the "channel width," which is a critical parameter, may be more readily controlled. For the purposes of this invention, the N-region will be referred to as a "pot" or "bathtub" and it is the ability to accurately control the depth of the "tub" which permits accurate control over the size of the channel. There is provided by the subject invention a method for accurately controlling the tub depth such that the formation of a channel with a predetermined width is assured by state-of-the-art diffusion techniques.

The third problem with prior art junction field effect transistors relates to the problem of large area bottom contact which is necessitated by the PN junction isolation. The subject device is provided with dielectric isolation thereby eliminating the need for a large area bottom gate which necessarily exists when PN junction isolation is utilized.

The fourth problem associated with junction field effect transistors is the necessity of providing two gate regions. Heretofore it was assumed that in order to achieve the aforementioned pinch effect, two gates lying on either side of the carrier flow were necessary in order to pinch off the carrier flow. It has been found that only one gate, when utilized with the subject dielectric layer, is all that is necessary in order to pinch off the carrier flow. This not only results in a saving of the number of gates employed but also results in the aforementioned reduction of parasitic capacitance.

In summary, the subject device is isolated dielectrically and not by utilizing PN junction techniques. The utilization of a dielectric isolation layer not only increases the frequency response of the device by eliminating parasitic capacitance, but also permits a reduction in the number of gate regions necessary to provide for the aforementioned pinch effect. In addition, when two gates are utilized in order to increase the gain of the device, the bottom gate is made considerably smaller than the prior art bottom gates and is connected to the top gate internal to the N-region by a deep diffusion at one point along one of the gates.

It will be appreciated that the dielectric layers used in prior art junction field effect transistors, although being utilized for isolation, have included in the structure a bottom gate which is coextensive with the entire device. This prevents the functioning of the dielectric layer to reduce parasitic capacitance and in no way indicates that the bottom gate is unnecessary.

The subject invention also includes a method of fabricating junction field effect transistors such that the channel width can be accurately controlled by controlling accurately the depth of the tub or pot. The control of the depth of the pot or tub coupled with accurate control of top gate diffusion depth into the tub provides accurate control of the channel width.

It will be further appreciated that the subject junction field effect transistor can take either a single gated or a double gated form corresponding to the use of a single gate or a double gate. In addition, the device can be fabricated either in a rectangular form or in a form involving concentric rings. The considerations going into the choice of the particular geometric configuration relate to the length of the gate regions and thus the length of the active channel.

Referring to the method of fabrication, it has already been stated that the channel width is a critical parameter. The method of fabrication utilizes certain protrusions or mesas as indicators when the devices are lapped so as to achieve the final tub type structure. In addition, in order to insure that the indicator channels are properly formed, an anisotropic etch is utilized with a preferentially etchable semiconductive material. The anisotropic etch with this particular type of material provides for a selective etching to increase the accuracy of the depth of the etch. It is first used in etching indicator channels whose bottom surfaces later define a first mesa. In addition, anisotropic etching techniques are utilized in the formation of a second mesa after indicator channels have been formed. The accuracy with which the indicator channels and the mesas are formed is directly related to the control of the tub or pot depth and thus is directly related to the critical channel width.

SUMMARY OF THE INVENTION

It is therefore an object of this invention to provide an improved junction field effect transistor.

It is another object of this invention to provide a junction field effect transistor with dielectric isolation so as to minimize parasitic capacitance and enable the use of a single gate region in order to control the output of the device.

It is a still further object of this invention to provide an improved junction field effect transistor utilizing dielectric isolation and two gate regions with both of the gate regions confined to a minimum channel breadth such that parasitic capacitance associated with large area gate regions is eliminated.

It is a further object of this invention to provide an improved junction field effect transistor in which two gate regions are utilized which are interconnected by a deep diffusion interior to the tub or pot in which the gates are situated.

It is a still further object of this invention to provide an improved method for use in the fabrication of junction field effect transistors in which the channel width is controlled by the use of indicator channels etched into a starting material which is to later form the tub or pot of the field effect transistor.

It is a still further object of this invention to provide an improved method of fabrication of junction field effect transistors which utilize a double mesa structure for controlling the pot or tub depth and thus the channel width of the completed field effect transistor.

It is a further object of this invention to provide a method of fabrication of field effect transistors utilizing indicators, a double mesa structure, and an anisotropic etch with preferentially etchable semiconductive material so as to control the tub or pot depth and thus the channel width of the completed field effect transistor.

Other objects of this invention will be better understood upon reading the following description of the accompanying drawings.

FIGS. *6a–6e* show intermediate and final structures associated with one method of fabricating the pot or tub into which the active junction field effect transistor elements are diffused, indicating parameters necessary in the control of the depth of the finally completed tub or pot.

Figure 7:
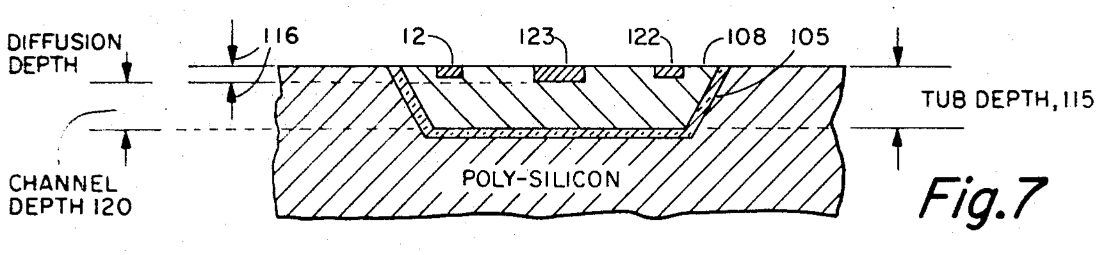

FIG. 7 is a cross-sectional diagram of the completed junction field effect transistor showing the relationship of the channel width to the tub or pot depth and the diffusion depth.

FIGS. *8a–8d* indicate intermediate and final structures formed by the subject method when an interconnected double-gate junction field effect transistor is to be fabricated.

BRIEF DESCRIPTION OF THE INVENTION

Described herein is a junction field effect transistor which utilizes dielectric isolation as opposed to junction isolation so as to isolate the drain of the device from the source. The use of the dielectric isolation technique eliminates parasitic capacitance associated with prior art devices, while at the same time enabling proper functioning of the device with use of only one gate region. The use of the single gate region permits a decrease in the total gate area and thus a decrease of up to 90 percent in the parasitic capacitance normally associated with junction field effect transistors. A double gate configuration is provided to increase the gain of the device wherein the total contact area is also minimized due to the provision of the dielectric isolation. A method is provided for controlling field effect transistor channel width by controlling extremely accurately the depth of the tub or pot into which the active elements of the device are diffused. The accuracy of the tub or pot depth is a direct result of the use of indicating channels or indicators which are accurately formed in the semiconductor material utilized in the tub or pot. In the preferred embodiment the channels are accurately formed by use of an anisotropic etchant in combination with crystalline material of the (100) crystallographic configuration. In addition, after the indicator channels have been etched in the semiconductor starting material, the semiconductor material is subjected to a further anisotropic etching step which is again necessary in order to provide for accurate determination of tub depth. A method is also provided for interconnecting two gate regions when two gates are utilized in order to improve device gain. These gates are interconnected by deep diffusion lying wholly within the tub or pot by initially providing the starting material with a series of doped regions either by diffusion or by "epi-refill" techniques. These doped regions form the bottom gate and a pipe-like interconnecting region for the completed device.

DETAILED DESCRIPTION OF THE INVENTION

Figure 1:
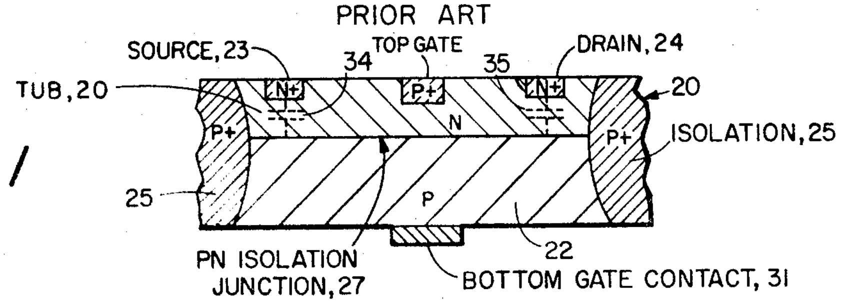
FIG. 1 is a cross-sectional diagram of a conventional prior art junction field effect transistor showing the extent of the bottom gate with which is associated the aforementioned parasitic capacitance.

Referring to FIG. 1, a conventional junction field effect transistor 20 is shown composed of an N-type bathtub 21, a P-type wafer 22 with source and drain contact diffusions 23 and 24, respectively, diffused into the tub from its top surface. Also from this top surface is diffused a P+ isolation region 25 which extends downwardly into the wafer past the PN isolation junction 27 alongside the N-type bathtub 21. Diffused into the top surface of the tub 21 is a top gate region 30. The bottom gate region for the device is the P-type wafer material 22. Electrical contact is made to the bottom gate region through the wafer by a bottom gate contact 31. Alternately the top gate region 30 is connected to the bottom gate 22 through the isolation region 25. In this cross-sectional view, the bottom gate is coextensive in area with the PN isolation junction 27. In addition, the sidewalls of the tub 21 are also in contact with the bottom gate by means of the P+ isolation region 25. This, in effect, surrounds the N-type region 21 with a P+ isolation region which, while effective in isolating the source from the drain of the device or from any other devices located within the wafer, also provides for a considerable amount of parasitic capacitance which is proportional to the amount of surface area of the tub 21 which is contacted by the P and P+ regions. The majority of the parasitic capacitance is effectively, therefore, between the bottom gate 22 and either the source or the drain, 23 or 24, as shown by the phantom capacitors 34 and 35.

As mentioned hereinbefore, the conventional junction field effect transistor suffers in frequency response from the existence of so much parasitic capacitance which is due to the inordinately large area represented by the bottom gate PN isolation junction 27 in addition to the areas of the tub 21 which are contacted by the P+ isolation 25.

Figure 2:
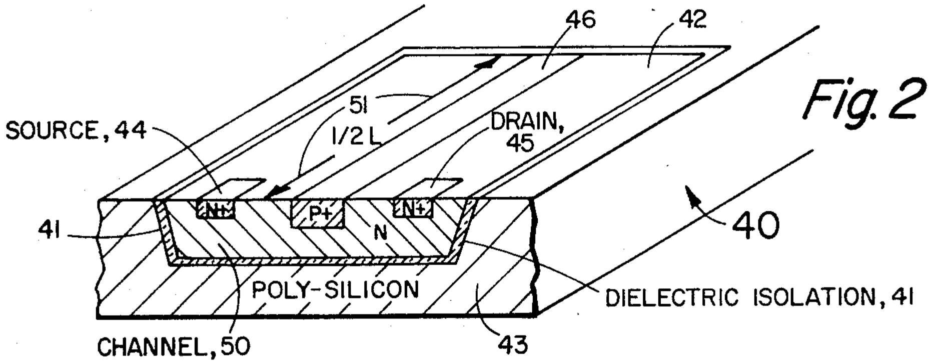
FIG. 2 is a diagram showing the subject junction field effect transistor utilizing a dielectric isolation technique and a single gate region.

Referring to FIG. 2, one embodiment of the subject junction field effect transistor is denoted by the reference character 40. This junction field effect transistor is different from the conventional prior art junction field effect transistors shown in FIG. 1, in two important ways. As can be appreciated from inspection of FIG. 2, the junction field effect transistor 40 is provided with a dielectric isolation barrier 41 such that the N-type tub or pot 42 is completely isolated from a polycrystalline silicon substrate material 43. It will be appreciated that there is no junction between the outer surfaces of the tub 42 and the polycrystalline silicon 43 due to the dielectric barrier 41. The thickness of this barrier is not critical although the thicker the barrier the greater the decrease in parasitic capacitance for the individual device. In one embodiment, the dielectric layer is a layer of silicon dioxide although other dielectric layers are considered as being within the scope of this invention. Other dielectric materials which may be used include silicon nitride. Into the N-type tub 42 are diffused source and drain N+ type contact regions 44 and 45. Inbetween these two contacts there is diffused a single P+ region 46 which serves as the aforementioned single gate region for the device. It will be appreciated that the gate region 46 extends entirely across the device from one side of the dielectric isolation barrier 41 to the other such that carriers migrating from the source to the drain or vice versa must pass through a channel area 50 which is directly beneath the gate region 46 and extends downwardly until it meets that portion of the dielectric barrier 41 directly underneath the gate. It is thus impossible for any carriers to bypass the channel. The length of the gate is indicated by the arrows 51 which refer to one-half the actual length of the P+ region 46. In general, it is desireable to increase the active channel area of the device by increasing the length of the P+ region 46 in a single direction as opposed to forming the P+ region 46 in a snake or circular configuration. Alternately, many JFET regions may be diffused into a single tub and connected in parallel.

The channel area, therefore, lies directly beneath the gate 46 and the width of this channel, which is the vertical distance between the bottom of the P+ region 46 and the top of the barrier region 41, is taken to be the channel width and is the aforementioned critical parameter. It is a finding of this invention that by the application of a predetermined potential to the single gate region 46, the junction field effect transistor thus formed can in fact be saturated. This is to say that the migration of carriers from source to drain or vice versa, can be halted by the appropriate application of an electrical potential to the gate region 46 without the necessity of providing a second gate region immediately beneath the first gate region so as to form the prior art channel. There exists in this single gated configuration a pinch effect which effectively raises the resistance of the entire device to a predetermined level depending on the magnitude of the potential applied to the gate region 46. By eliminating the necessity of a second gate region and the excessive area covered by this second gate in the prior art devices, the parasitic capacitance associated with this second gate is completely eliminated.

Figure 3:
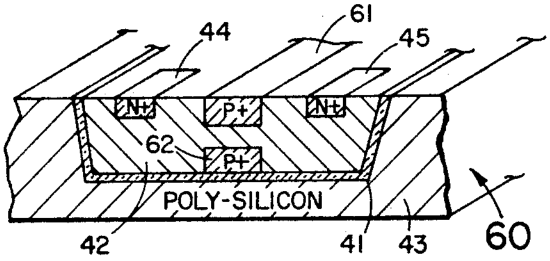
FIG. 3 is a diagram showing a double-gated junction field effect transistor made in accordance with the teachings of this invention in which the two gates are not electrically connected and in which the bottom gate area is minimized to prevent parasitic capacitance.

As shown in FIG. 3, a double gated device 60 is shown with a top gate region 61 and a bottom gate region 62. It will be noted, however, the top surface area of the bottom gate region is reduced to match the bottom surface area of the top gate region 61. This is made possible because of the dielectric isolation barrier 41 which is identical to the barrier shown in FIG. 2. The configuration shown in FIG. 3 indicates no electrical connection between the P+ region 62 and the P+ region 61. Without this connection the device shown in FIG. 3 has only slightly better operating characteristics than the device shown in FIG. 2.

Figure 4:
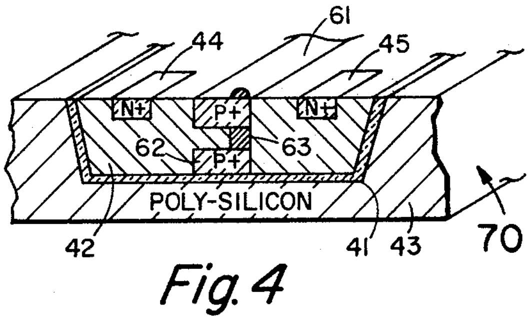
FIG. 4 is a diagram showing a double-gated junction field effect transistor fabricated according to the teachings of this invention and in which the top and bottom gates are interconnected by an internal deep diffused pipe therebetween.

Referring now to FIG. 4, a double-gated field effect transistor is shown with the top gate region 61 being connected to the bottom gate region 62 by a deep diffused region 63 which is completely internally contained in the pot or bathtub 42. The formation of the connecting region 63, referred to hereinafter as a "pipe diffusion," will be discussed in connection with FIGS. 8*a*–8*d*. It will, however, be appreciated in connection with this figure that the bottom gate region 62 also has associated with it a minimized area again due to the dielectric isolation barrier 41. The increase in gain as well as the frequency response of the device shown in FIG. 4, as compared to the devices shown in FIGS. 1, 2 and 3, is given by the following table:

TABLE I

Performance ratios of various JFETs For A Particular Top Gate Geometry

| Device | Low frequency gain | Gate-source or gate-drain capacitance | maximum frequency≅ of operation | gain capacitance |
|---|---|---|---|---|
| figure 1 | $G_{m_1}$ | $C_1$ | $f_1$ | |
| figure 2 | $G_{m_1}/2$ | $C_1/10$ | $5f_1$ | |
| figure 3 | $G_{m_1}/2$ | $C_1/10$ | $5f_1$ | |
| figure 4 | $G_{m_1}$ | $C_1/5$ | $5f_1$ | |

In a typical operating configuration $f_1 = 300$ MHz. Thus a 1.5 gigahertz operating frequency is obtained by the subject JFETS. The device of FIG. 4 is superior to the devices of FIGS. 2 and 3 in that the higher low frequency gain allows more output power when operated at intermediate frequencies, for example at $2f_1$, where the prior art devices do not operate at all.

It will be appreciated that the devices shown in FIGS. 2, 3 and 4 differ generically from prior art junction field effect transistors and that the above cited advantages occur as a direct result of this difference. It cannot be emphasized more strongly that the difference lies generically in the type of isolation utilized. Heretofore, junction field effect transistors were not utilized in high frequency amplifying circuits because of their limited frequency response. Instead bipolar transistors having considerable non-linearities, due to the emitter-base junction were utilized in applications involving the gigahertz frequency domain. It is becoming increasingly apparent that bipolar devices, because of their non-linearities are unacceptable in certain types of communications applications and particularly when certain filtering characteristics of the circuit are considered. In addition, the bipolar devices are not self-limiting in the sense that if one portion of the device begins to heat up, more current is drawn through the bipolar device, thus heating up the localized area until the device fails due to crystal melting or decomposition. Junction field effect transistors not only exhibit more linearity than the bipolar devices, but are self-limiting in the sense that whenever any portion of the device heats up the current through the device is diminished thereby cooling the device. The use of the junction field effect transistors heretofore has been limited primarily because of its lack of high frequency response. It was long ago recognized that the minimal distortion characteristics of the junction field effect transistors as well as the self-limiting aspect just mentioned would provide an ideal amplifier or oscillator for high frequency applications. In the present invention the generic switch in isolation from PN junction isolation to dielectric isolation reduces the parasitic capacitance to such an extent that the junction field effect transistor can now be successfully utilized in high frequency applications as a small signal device for gigahertz operation, as a high power amplifier at UHF frequencies and as a portion of a radiation hardened circuit for high frequency signals. In addition, a junction field effect transistor fabricated according to the subject technique, can be utilized in lieu of conventional power oscillators because of the low noise introduced by the more linear characteristics of the JFET thus produced.

Figure 5:
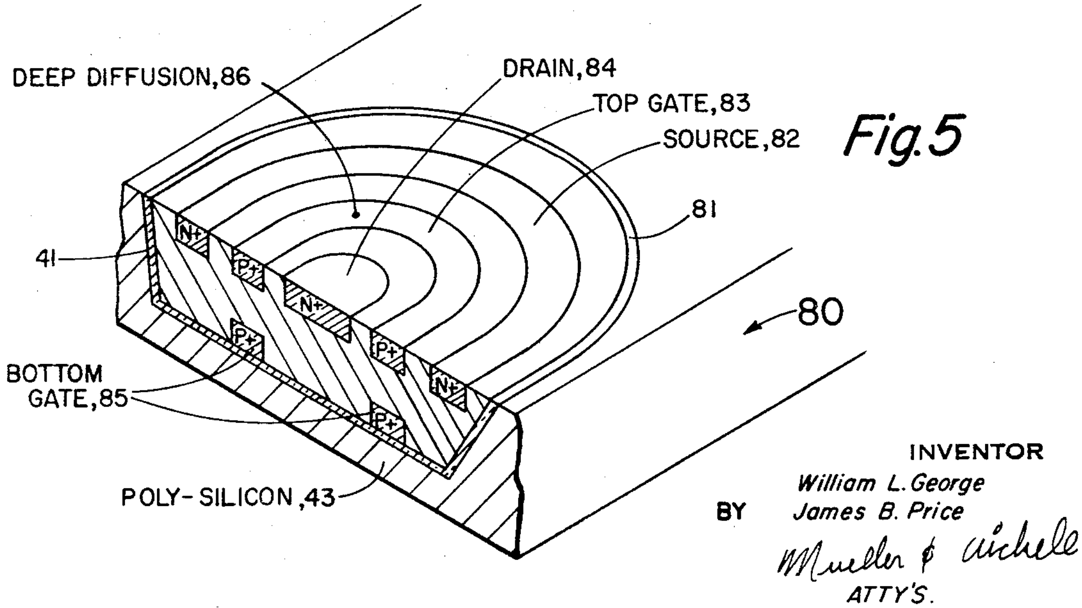
FIG. 5 shows an analogous geometric configuration to the rectangular configuration shown in FIG. 4 in which the junction field effect transistor is fabricated with a concentric series of ring type elements.
Figure 6A:
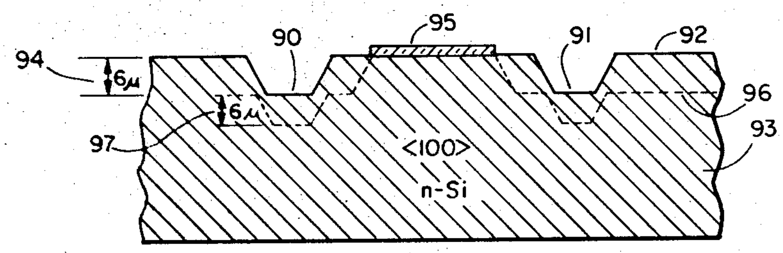
Figure 6B:
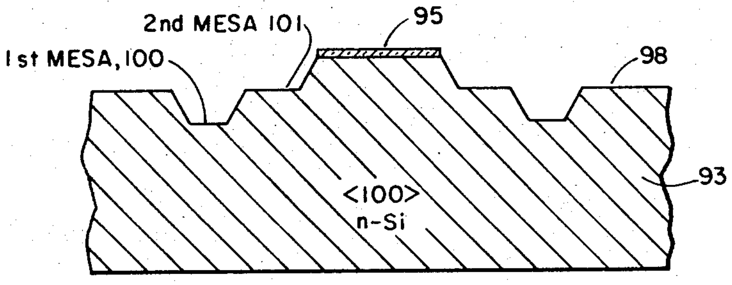
Figure 6C:
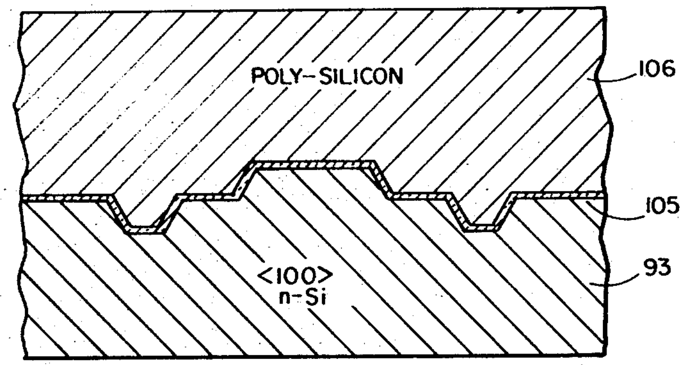
Figure 6D:
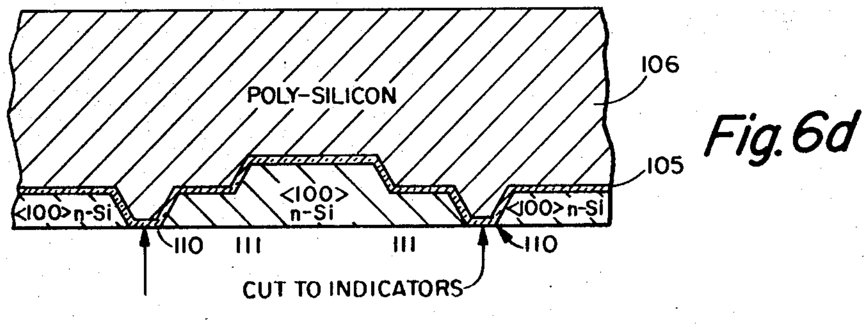
Figure 6E:
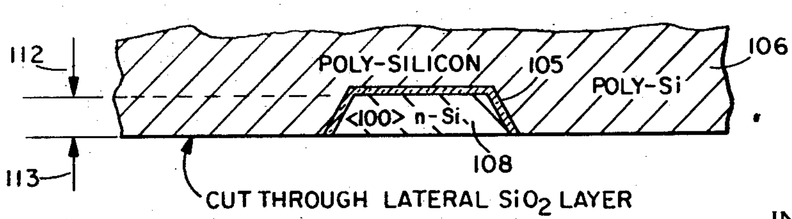

The configurations shown in FIGS. 2, 3 and 4 indicate a rectangular device which is preferred because of the length of the P+ gate region 46. As shown in FIG. 5, however, the device shown in FIG. 4 can be fabricated in an analogous concentric ring type form. In this figure the device is embedded in polycrystalline silicon labelled by the reference numeral 43 as before. The dielectric isolation barrier for the device shown by the reference numeral 81 is shown as having an annular top portion 81. Interior to this isolation ring is a source contact also in annular form shown at the reference numeral 82. Interior to and spaced from this annular source ring 82 is an annular top gate 83, interior to which is formed a circular drain 84. The device 80 shown in FIG. 5 is also provided with a bottom gate 85 which is connected electrically to the top gate 83 by a deep diffusion 86 somewhere along the regions 83 and 85. It will be appreciated that an analogous annular formation is associated with the rectangular configuration shown in FIG. 2 insofar as the bottom gate 85 is removed from the structure 80. An analogous annular configuration to the structure shown in FIG. 3 is the structure shown in FIG. 5 absent the deep diffusion 86.

As mentioned hereinbefore, the depth of the bathtub or pot as well as its uniformity is critical to the ability to form a uniform channel with a controllable and uniform width. It will be appreciated that once the exact bathtub depth is known, knowing the crystalline structure of the material in the bathtub and the diffusion rates into this material, permits the diffusion of the active elements into the tub to specific depths which can be calculated. In the prior art, there is considerable difficulty in ascertaining the actual depth of the tub or pot. Thus indirect methods of measurement are employed which are wholly inadequate and which result in non-uniform JFETs as well as some which are completely inoperable due to the fact that no pinching effect can be obtained by the application of any voltage, no matter how high, across the gate terminals.

One method of providing an accurate determination of the bathtub depth is shown by the intermediate and final structures in FIGS. **6*a*–6*e*. In connection with FIGS. 6*a*–6*e*, three characteristics should be kept in mind. The first is the use of indicator channels in the structure shown in 6*a*. The precise depth of these indicator channels is obtained by using an anisotropic etch in conjunction with a (100)** N-type silicon material. At this point it should be noted that any semiconductive material suitable for the tub may be utilized as long as it has an anisotropic etch property.

The semiconductor material may be P or N-type such that P-materials may be substituted for the N-materials shown in the drawings and vice versa. The second important feature shown in FIG. **6*b*, to be the double mesa formed by again etching the channelled structure shown in FIG. 6*a* with an anisotropic etch. The use of the anisotropic etch at this step provides that the distance between the lowest point in the structure in FIG. 6*b*** and the first mesa be known, and that the distance between the first mesa and the topmost or second mesa also be known. The third important factor will be apparent in considering the structure shown in FIG. *6d*. In this figure, the results of the first or coarse lapping step are shown. It is at this point where the indicators, originally channels and now appearing as stripes, limit the coarse cutting step such that the technician or operator knows once he has reached these stripes that he has only a predetermined additional distance to grind and can therefore utilize a fine polishing process to finally polish to the top surface of the bathtub or pot. Primarily, this first mesa provides the technicians with a depth indicator, a very visible indicator which shows that only 6 microns more material need be removed to complete the lap-polish operation. The technician then polishes the structure shown in FIG. 6d down to the second or next mesa which is obtained when the dielectric layer is removed. At this point the flatness of the polished surface of the bathtub is apparent.

Referring now to a more detailed description of the method associated with the structure shown in FIGS. *6a–6e*, the FIG. *6a* indicates that an N-type silicon starting material is utilized. This wafer is in one embodiment a 24 mil N-type (100), 0.6 ohm-centimeter wafer which is planarized and polished at the top surface. The taper is held at the top surface to less than 0.1 mil. The wafer is oxidized and a photoresist pattern is provided (not shown) so that the indicator channels 90, 91 may be formed into the surface 92 of the wafer 93. These channels are anisotropically etched to a depth in one case of 6 microns, as shown at 94.

At this point a discussion of the etchants and the crystal orientation of the tub material follows.

The purpose of the anisotropic etchant is to etch the starting material only in one direction, and the direction is perpendicular to the planar surface of the starting material. This ensures that the plane surfaces resulting from the etching steps are parallel to this planar starting surface since the only plane etched is the one parallel to the planar starting surface. Thus, the depth of the etch as measured from the planar starting plane is uniform and thus readily controlled by the etch rate of the etchant.

If the starting material is oriented so that its surface is a plane of maximum etch rate and the walls to be etched on slow etching planes inclined at other than 90° to the surface an additional advantage is obtained. The apertures formed when this material is etched by an anisotropic etchant have inclined sidewalls. The angle of inclination of these sidewalls is known such that depth of an aperture can be readily ascertained by measuring the width of the top of the aperture and the width of the bottom surface of the aperture. In the preferred embodiment, a potassium hydroxide etchant is used with an alcohol additive and water. This particular etchant etches only the (100) planes of silicon at any appreciable rate. That is to say, this particular etchant etches in a preferential direction such that the (111) planes and the (110) planes which are exposed during the etching process are not etched significantly. The depth of the channel 94 is controlled by the known geometric relations between the (100) planes the the known etch rates for potassium hydroxide. It is therefore a relatively simple matter knowing the aperture size of the mask and measuring the flat bottom of the channel 90 or 91 to obtain the depth of the channel. In other words, if the aperture pattern width is known and the angle with which the etchant etches down, then measurement of the width of the bottom will automatically yield the depth of the channel.

After the N-type silicon material 93 is provided with the channel indicators 90 and 91, the oxide on the top surface 92 is further patterned to conform with the structure shown at 95. The exposed top surfaces of the N-type material 93 are then subjected to an additional anisotropic etching step so as to remove a uniform additional six microns in a vertical direction only. What remains is shown both by the dotted line 96 in FIG. *6a* and the top surface 98 in FIG. *6b*. It will be appreciated that the depth of this second etching step, shown at 97, in FIG. *6a*, is also readily controlled when (100) silicon is etched with potassium hydroxide. The result of this second etching step is a two mesa-type structure. The first mesa being the bottom of the channel 90 and is shown in FIG. *6b* by the reference character 100. The second mesa, 101, is actually the most extensive portion of the surface 98. At this point it should be noted that the starting material is N-type 0.1 to 1.0 ohm centimeter (100) oriented, and approximately 24 mils thick. The material is N-type 0.1 to 1.0 ohm centimeter to allow channel thickness control. The (100) orientation is selected to utilize anisotropic etch control of geometry. The starting material is 24 mils thick to minimize warpage during and after polycrystalline growth on the substrate. This polycrystalline growth is shown in connection with FIG. *6c*.

From FIG. *6b*, the remaining oxide layer 95 is stripped therefrom and the wafer reoxidized to form a continuous dielectric layer 105 on top of the double mesa structure 93. On top of this oxidized structure is then formed 10 or so mils of polycrystalline silicon, shown at 106 as backing material. Polycrystalline silicon is used as the backing material because it adheres to the dielectric layer, is grindable by abrasives used in a subsequent lapping step, is resistant to high temperature processing necessary to drive in the diffused active regions of the device, and has a temperature coefficient of expansion similar to the tub material. It will be appreciated that any backing material having these properties may be utilized and that this invention is not limited to the use of silicon tubs or polycrystalline silicon backing material.

After the growth of the backing material, the bottom or back of the wafer is lapped. This usually involves both a coarse and a fine polishing step and it is these steps which are critical to the formation of the uniform pot or bathtub.

As shown in FIG. *6d*, the bottom or back portion of the wafer 93 is lapped or etched until the oxide on the bottom of the indicator channels 90 and 91 formed in the wafer 93 is exposed. These exposed portions are shown by the arrows 110. In the polishing process, it is possible that a taper can develop. If this occurs, one portion of the dielectric layer 105 will be exposed before another portion. Because the dielectric layer 105 is more resistant to polishing than the silicon material, the polishing action slows at the exposed dielectric layer while continuing until the diametrically opposite side of the dielectric layer is also exposed. In the circular configuration, the entire circle is finally exposed due to the automatic taper adjustment provided by the harder and more durable dielectric layer. Thus, the dielectric isolation barrier or layer serves an additional function of providing that the taper during the lapping step be minimized in addition to enabling the production of a parasitic capacitance-free junction field effect transistor. This provides that the top of the tub be flat and parallel to the bottom of the tub. After all of the indicators have been exposed, the remaining 6 microns are abraded away by an ultra-fine polish until such time as the second mesa is reached. This is indicated by the exposure of that portion of the dielectric layer 105 which is resting on the second mesa. This is shown by the arrows 111. Again, it is the dielectric layer which minimizes taper during the fine polishing step. The fine polishing step is continued until the dielectric layer 105 disappears from all but the sidewalls of the tub. The result is the structure shown in FIG. 6e after the lateral dielectric layer on the second mesa has been cut through. As can be seen, there exists in FIG. 6*e* an inverted bathtub or pot region 108 completely surrounded by what remains of the dielectric layer 105. The depth of the tub 108 is shown by arrows 112 and 113. It is determined by the distance 94 in FIG. 6*a*. As shown in FIG. 7, once knowing the tub depth 115 and knowing the diffusion depth by conventional means as shown by the arrows 116, the channel depth 120 can be easily ascertained.

It will be appreciated that the bathtub or pot thickness 115 can be calculated from its measured width on the completed substrate. The tub thickness equals $(W-W_o)/1.41$ where $W_o$ is the width measured on the photoresist mask of the oxide layer 95 in FIG. 6*a* where W is the width measured on the completed substrate. The constant 1.41 is two times $(\tan\theta)^{-1}$ where $\theta$ is the (111)–(100) interplanar angle.

It will be appreciated that conventionally a 10,000 angstrom dielectric layer of silicon dioxide is utilized such that the dielectric portion 105 in FIG. 7 is 10,000 angstroms in thickness. The pot depth thickness averages approximately 4 microns. Into the bathtub 108 are diffused the source and drain regions 121 and 122, respectively, as well as a P+ region which serves as the single gate shown at 123. In an RF JFET measuring along the top surface of the tub, the source and drain contacts typically occupy about 0.1 mil with the spacing between the contacts and the gate region 123 being on the order 0.2 mils. The gate itself has a width generally of 0.1 mil making the overall device from the outer edges of the source and drain regions approximately 0.7 mil. It will therefore be appreciated that the length of the P+ region 123 is one-seventh of the length of the bottom of the tub 108. This results in clearly one-seventh the parasitic capacitance associated with prior art junction field effect transistors.

Figure 8A:
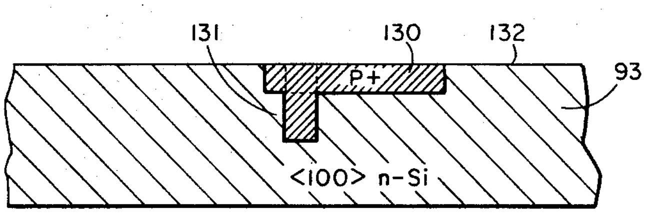
Figure 8B:
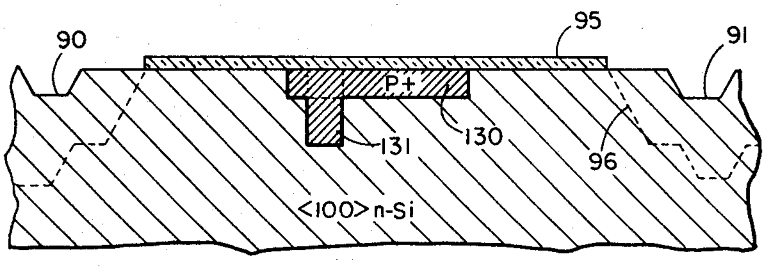
Figure 8C:
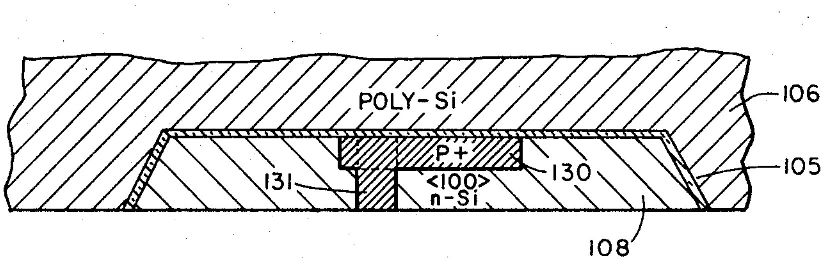
Figure 8D:
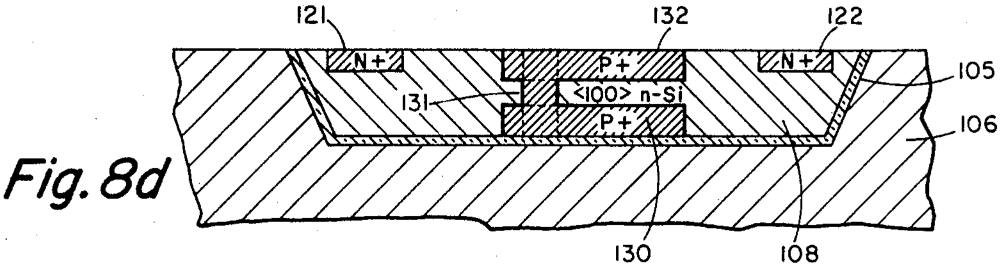

Referring now to FIGS. 8*a*–8*d*, it will be apparent how a bottom gate region is formed. The initial starting material 93, after polishing, is provided with a P+ diffusion shown at 130. This diffusion extends typically 5 microns down from the surface 132 of the crystalline material 93. If the top and bottom gates are to be internally connected a further diffusion is performed so as to form the structure 131 depending downwardly through the P+ region 130. Thereafter, as shown in FIG. 8b, the starting material 93 is patterned, channeled and etched in exactly the same manner as shown in FIGS. 6*a*–6*e*. This results in the structure shown in FIG. 8*c* with polycrystalline material 106, dielectric layer 105, bathtub 108 now containing the P+ region 130 and the pipe diffusion 131. The structure shown at FIG. 8*c* is then flipped over and provided with a top gate 133 diffused into the N-type material 108 from the top surface thereof so as to contact the structure 131. Also, diffused in from the top surface are the source and drain contacts 121 and 122 to complete double-gated JFET. Alternately, the regions 130 and 131 can be etched out and then filled with P+ material in an "epi-refill" processing step prior to forming the indicator channels.

What is claimed is:

1. A method for making a junction field effect transistor with a controllable channel width by accurately controlling the depth of the tub in which the active transistor elements are situated comprising the steps of:

masking the planar surface of a body of semiconductor material of a first conductivity type with a mask having at least two apertures of a predetermined size therethrough, said apertures being located outside and spaced from an area on said planar surface which is to serve as the bottom surface of said tub, etching said body of semiconductor material of a crystallographic orientation which is preferentially etched in a direction perpendicular to said planar surface by an anisotropic etching solution which preferentially etches crystallographic planes parallel to said planar surface through said apertures such that said semiconductor material is etched to a predetermined depth beneath said planar surface so as to form indicator channels outside of said area the bottom of each of said channels being planar and forming a first mesa parallel to said planar surface having an area of a size that is significant with respect to the area of the bottom surface of said tub, masking a portion of said planar surface interior to said predetermined area, the configuration of said portion corresponding to the configuration of the bottom surface of said tub, etching the unmasked portion of said planar surface for a predetermined vertical distance with said anisotropic etching solution so as to form a second mesa parallel to said planar surface having an area of a size that is significant with respect to the area of the bottom surface of said tub removing said mask, depositing a uniform layer of dielectric material over the entire surface of said body thus exposed, depositing on top of said dielectric layer a quantity of a grindable backing material having a high melting point, free of contaminants, bondable to said dielectric material and having a thermal expansion characteristic close to that of said semiconductor material, lapping said body of semiconductor material from a side furthest from said backing material with a coarse abrasive material until the dielectric material covering said first mesa is at least partially exposed, continuing lapping said body of said semiconductor material and said dielectric material with the coarse abrasive material until all the dielectric material covering said first mesa is exposed, lapping said body of silicon with a fine abrasive from the dielectric material covering said first mesa until said second mesa is at least partially exposed, as indicated by the removal of at least part of the dielectric material covering said second mesa, continuing lapping said body of said semiconductor material and said dielectric material until all of the dielectric material is removed, thereby completing the formation of a dielectric lined tub in said backing material with an exposed surface which is parallel to the bottom of said tub and at a distance therefrom equal to the thickness of semiconductor material removed by said second etching step, and diffusing into said tub from said top surface, source, gate and drain regions to a predetermined depth such that a channel is formed between the bottom of said gate region and said bottom surface of said tub, said channel having a width equal to the distance between said top and bottom surfaces of said tub minus the depth of diffusion of said gate region.

2. The method as recited in claim 1 wherein said body has a (100) crystallographic structure.

3. The method as recited in claim 2 wherein said body is silicon and said backing material is polycrystalline silicon.

4. The method as recited in claim 3 wherein said anisotropic etching solution is potassium hydroxide, whereby the side walls of said tub are inclined at an angle to permit ease in the determination of the depth of the etch in each of said etching steps.

5. The method as recited in claim 1 wherein said body is first provided with a region of semiconductor material of a conductivity opposite to that of the semiconductor material in said body, said region extending downwardly from said planar surface within the region which is to become said tub and forming a second gate region.

6. The method as recited in claim 5 wherein said second gate region is provided with an appendage extending downwardly from a portion of said second gate region for a distance equal to or greater than the distance between said masked surface and said second mesa, said appendage serving to electrically connect said second gate region to said first mentioned gate region whenever said first mentioned gate region is diffused into said tub so as to extend down to said appendage.

7. A method for regulating and controlling the depth of a tub-like semiconductive region which extends down into a substrate material comprising the steps of:

masking the planar surface of a body of semiconductive material with the mask having apertures of a predetermined size therethrough, said apertures being located outside and spaced from an area on said planar surface which is to serve as the bottom surface of said tub-like structure, etching said body of semiconductive material of a cystallographic orientation which is preferentially etched in a direction perpendicular to said planar surface by an anisotropic etching solution which preferentially etches crystallographic planes parallel to said planar surface through said apertures such that said semi-conductive material is etched to a predetermined depth beneath said planar surface so as to form corresponding apertures therein the bottom surface of each of said apertures in said body being planar and forming a first mesa parallel to said planar surface having an area of a size that is significant with respect to the area of the bottom surface of said tub-like structure, masking over the area on said planar surface which is to serve as the bottom surface of said tub-like structure with a mask impervious to said anisotropic etching solution, etching the exposed surface of said body with said anisotropic etching solution to a depth equal to the desired tub depth, said depth being determined by measurements of the extent of the exposed surface after etching, the mask dimensions of said last mentioned mask and characteristics of said crystallographic structure and its response to said anisotropic etching solution, the most extensive surface formed by said second etching step forming a second mesa, having an area of a size that is significant with respect to the area of the bottom surface of said tub-like structure, removing said last mentioned mask from over top of said area, applying a uniform dielectric layer over top of said body, forming said substrate material on top of said dielectric layer, lapping said semiconductive material with a coarse abrasive material from a surface of said body opposite said etched surface until the dielectric material covering said first mesa is at least partially exposed, continuing lapping said body of said semiconductor material and said dielectric material with the coarse abrasive material until all the dielectric material covering said first mesa is exposed, and lapping said semiconductive material from said exposed dielectric material with a fine abrasive material until said mesa is at least partially exposed as indicated by the removal of at least part of the dielectric material covering said second mesa, and continuing lapping said body of said semiconductor material and said dielectric material until all the dielectric material is removed whereby the depth of the tub-like structure thus produced is equal to the depth of said second etching step and whereby the accuracy of the depth of the tub-like structure is increased by the use of the two mesas as visual cues or indicators in the lapping steps.

8. The method as described in claim 7 wherein said semiconductive material is silicon, wherein said backing material is polycrystalline silicon and wherein the depth of said tub-like structure is given by W-Wo/1.41 where Wo is the width of the mask used in said second etching step and W is the width of the top surface of said tub-like structure as finally completed.

* * * * *